United States Patent [19]

Kaifu et al.

[11] Patent Number: 4,889,795
[45] Date of Patent: Dec. 26, 1989

[54] PROCESS FOR FORMING PHOTORESIST PATTERN USING CONTRAST ENHANCEMENT LAYER WITH ABIETIC ACID

[75] Inventors: Katsuaki Kaifu; Maki Kosuge; Yoshio Yamashita; Takateru Asano; Kenji Kobayashi, all of Tokyo, Japan

[73] Assignees: Oki Electric Industry Co., Ltd.; Fuji Chemicals Industrial Co., Ltd., both of Tokyo, Japan

[21] Appl. No.: 159,292

[22] Filed: Feb. 23, 1988

[30] Foreign Application Priority Data

Feb. 23, 1987 [JP] Japan .................................. 62-37845
Mar. 4, 1987 [JP] Japan .................................. 62-47806

[51] Int. Cl.⁴ .............................................. G03F 7/26
[52] U.S. Cl. .................................... 430/326; 430/141;
430/156; 430/168; 430/162; 430/271; 430/273;
430/311; 430/312; 430/329
[58] Field of Search .............. 430/156, 141, 311, 312,
430/325, 326, 271, 329, 160, 162, 273

[56] References Cited

U.S. PATENT DOCUMENTS

| | | | |
|---|---|---|---|
| 2,772,972 | 12/1956 | Herrick et al. | 430/166 |
| 3,416,922 | 12/1968 | Süs et al. | 96/33 |
| 3,510,309 | 5/1970 | Lewis | 96/33 |
| 3,965,278 | 6/1976 | Duinker et al. | 427/54 |
| 4,148,654 | 4/1979 | Oddi | 430/192 |
| 4,238,560 | 12/1980 | Nakamura | 430/950 |
| 4,672,021 | 6/1987 | Blumal et al. | 430/156 |
| 4,745,042 | 5/1988 | Sasago et al. | 430/156 |

FOREIGN PATENT DOCUMENTS

| | | | |
|---|---|---|---|
| 110165 | 6/1984 | European Pat. Off. | 430/156 |
| 161660 | 11/1985 | European Pat. Off. | 430/312 |
| 1566802 | 5/1980 | United Kingdom . | |

OTHER PUBLICATIONS

Griffing et al., IEEE Electron Device Letters, vol. EDL-4 #1 Jan. 1983 "Contrast Enhanced Photolithography".

Primary Examiner—Charles L. Bowers, Jr.
Attorney, Agent, or Firm—Wenderoth, Lind & Ponack

[57] ABSTRACT

A process for forming a photoresist pattern comprises the steps of forming a photoresist layer on an underlying layer, forming a contrast enhancement layer for enhancing the contrast of light entering the photoresist layer on the photoresist layer, selectively exposing the photoresist layer through the contrast enhancement layer to light, and developing the photoresist layer to form a photoresist pattern. The contrast enhancement layer is formed as a layer containing a photobleachable agent and a material soluble in both of a nonpolar organic solvent and an aqueous alkali solution. The material is selected from the group of abietic acid, a derivative thereof, a rosin containing abietic acid as the main component, and a derivative thereof. The contrast enhancement layer is treated and removed simultaneously with development for the photoresist. The stability of a coating solution for the contrast enhancement layer is remarkably high. Therefore, the coating solution for the contrast enhancement layer can be sufficiently resistant to long-term storage.

16 Claims, 9 Drawing Sheets

Process Diagram for Explaining Principle of CEPL

FIG._2A
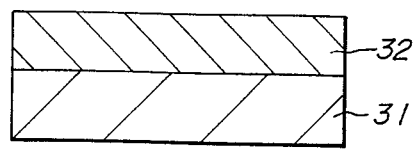
FIG._2B
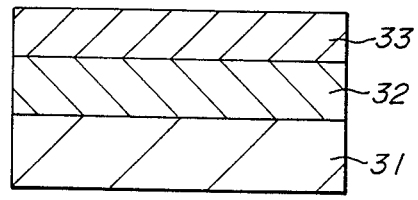
FIG._2C
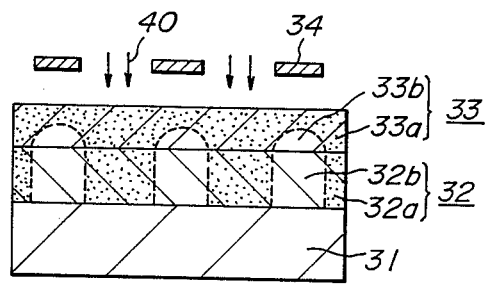
FIG._2D
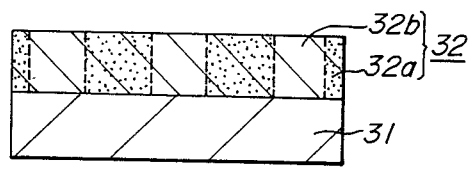
FIG._2E
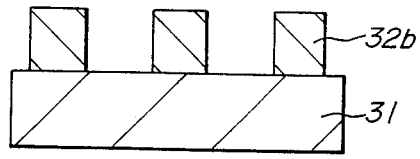
Process Diagram for Explaining Conventional Process for Forming Photoresist Pattern Bleaching Characteristic Curve

FIG_4

Absorption Spectrum Characteristics

Bleaching Characteristic Curve

Absorption Characteristics of DZ-1 Film

Bleaching Characteristic Curve of DZ-1 Film

FIG_8
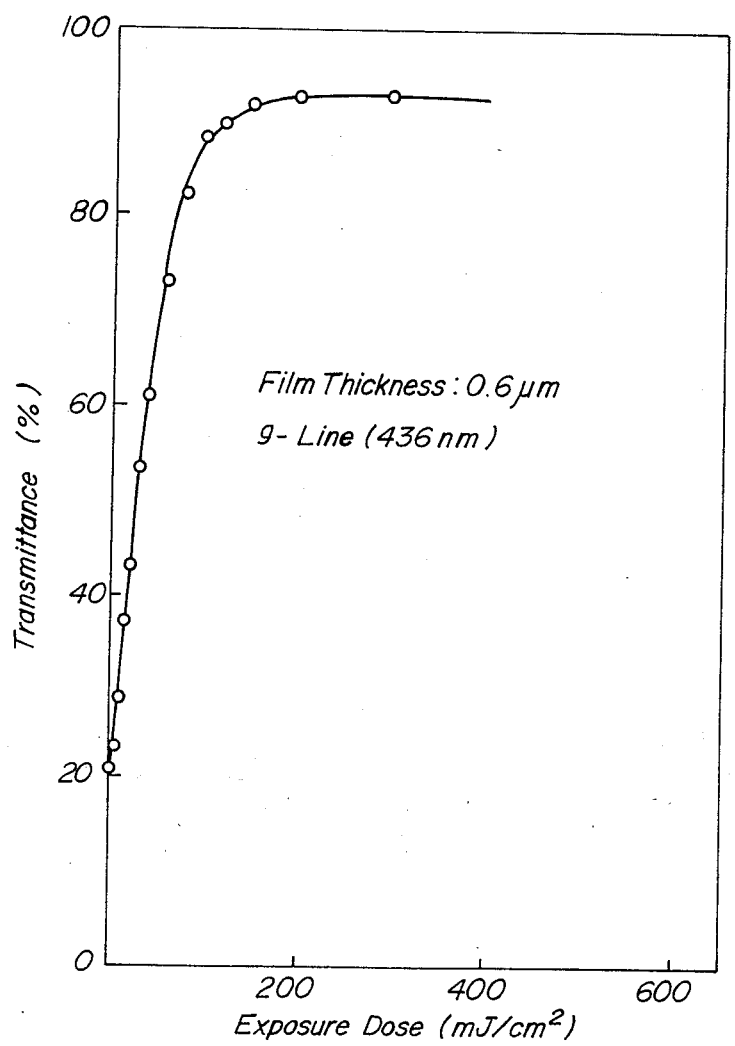
Bleaching Characteristic Curve of DZ-2 Film

*Process Diagram for Explaining Process for Forming Photoresist Pattern According to the Present Invention*

PROCESS FOR FORMING PHOTORESIST PATTERN USING CONTRAST ENHANCEMENT LAYER WITH ABIETIC ACID

BACKGROUND OF THE INVENTION

1. Field of the Invention

The present invention relates to a process for forming a photoresist pattern which is suitable for the production of a semiconductor integrated circuit, and particularly to a process for producing a photoresist pattern according to which a superfine pattern is formed with a high precision.

2. Description of the Prior Art

With the progress of the high density of a semiconductor integrated circuit, the minimum size of a pattern of a circuit to be integrated is made more and more fine. Accordingly, there is a great demand for a technique of forming a fine photoresist pattern of about 1 μm or a submicron or less with a high precision.

In general, the photolithography technique has heretofore been widely used as a means for patterning with a high precision by improving the resolution. Also the lithography technique using electron beams, X-rays, or ion beams as the ray source has been developed. However, the photolithography technique using light is advantageous when consideration is given to mass production, economy, and workability.

Various proposals have been made with respect to the process for forming a photoresist pattern according to the photolithography technique. According to, for example, a contrast enhanced photolithography technique (hereinafter abbreviated as "CEPL technique") as disclosed in IEEE Electron Device Letters, EDL-4, 1983, pp. 14 to 16 (literature I) and Journal of Vacuum Sciences and Technology, B3(1), Jan./Feb., 1985, pp. 323 to 326 (literature II), a photoresist pattern with a high resolution can be formed by the addition of a simple process, thus attracting attention.

The principle of the CEPL technique will now be explained with reference to FIG. 1.

FIGS. 1A to 1E are a process diagram for explaining the principle of the CEPL technique. Each figure is schematically drawn as a cross sectional view.

As shown in FIG. 1A, an underlying photoresist layer 12 to be subjected to patterning is provided on a silicon wafer (silicon substrate) 11. A thin photosensitive layer 13 (hereinafter often referred to as "CEL film") called a contrast enhancement layer is provided on the underlying photoresist layer 12. This CEL film is made of a material which at first shows high absorption of light with exposure wavelengths but shows lower absorption with a higher transmittance with an increase in the exposure does because it is bleached with light irradiation.

Since light reaches the region of a shadow of a mask 14 against a light source due to light diffraction and a focusing effect when light passes through a photomask 14, the light intensity distribution behind the photomask 14 assumes a state as shown in FIG. 1B. As a result, the contrast of a projected light image of the photomask is lower than the contrast threshold value of the underlying photoresist layer 12. Thus, photoresist patterning cannot be done with a sufficiently satisfactory resolution.

In this CEPL technique, selective light exposure is done by projecting a light image of the photomask 14 as shown in FIG. 1B on the underlying photoresist layer 12 through the CEL film 13. In this case, a portion 13a where the CEL film is bleached since the dose (exposure dose) is large, and portions 13b where the CEL film is not bleached since the dose is small are formed as shown in FIG. 1C. The transmittance of the CEL film 13 is partially largely changed by a difference in the degree of bleaching corresponding to the light intensity distribution. Thus, in an ideal case, the transmitted light intensity distribution assumes a state as shown in FIG. 1D. As a result, the light transmitted through the CEL film 13 has an enhanced contrast. Selective exposure of the photoresist layer 12 is done by irradiating the photoresist layer 12 with light having an enhanced contrast. By a subsequent development treatment, for example, a positive photoresist pattern 12a which is clear and sharp as shown in FIG. 1E is formed.

In the case of the above-mentioned conventional CEPL process, however, an additional step of removing the CEL layer prior to the development of the photoresist layer after light exposure is necessary as is apparent from FIG. 2.

This will be explained with reference to FIG. 2. An underlying photoresist layer 32 and a CEL film 33 are provided in this order on a substrate 31 (FIGS. 2A and 2B). Subsequently, irradiation with ultraviolet radiation is conducted through a photomask 34 to form exposed portions 32a and 33a and unexposed portions 32b and 33b in the same manner as described above (FIG. 2C).

After removal of the CEL layer 33 (33a and 33b) as shown in FIG. 2D, development of a photoresist layer 32 is done.

Specifically, development of the above-mentioned photoresist layer is conducted with an aqueous alkaline solution, while removal of the CEL is conducted with an organic solvent. Therefore, the above-mentioned additional step is necessary, thus making the process complicated.

According to the CEPL technique as disclosed in the literature II, the choice of a material for forming a CEL film 143 is important. The CEL film 13 as disclosed in the literature II is formed by dissolving diphenylamine-p-diazonium sulfate, which is a water-soluble diazonium salt, and polyvinyl alcohol as a binder polymer in water and applying the resulting solution onto an underlying photoresist layer 12.

However, in the process using the material as disclosed in the literature II, the diazonium salt is used by dissolving the same in water. Since this diazonium salt is decomposed by water, there is a problem that the CEL coating solution cannot be stably kept for a long time.

In a bleaching characteristic curve of this CEL film irradiated with light having a wavelength of 436 nm as shown in FIG. 3 in which the abscissa represents the exposure dose (mJ/cm$^2$) and the ordinate represents the transmittance (%), the transmittance in an unexposed portion is as high as at least 60%. Therefore, the contrast enhancement effect is not so large that formation of a clear and sharp photoresist pattern cannot be expected.

Thus, a first object of the present invention is to provide an excellent process for forming a resist pattern which can solve the problems of complicatedness of the steps of the above-mentioned process and instability of the coating solution used for formation of the CEL film.

A second object of the present invention is to provide a process for forming a resist pattern which can solve the problem of the contrast enhanced effect.

SUMMARY OF THE INVENTION

For attaining the above-mentioned objects of the present invention, the process for forming a photoresist pattern according to the present invention which process comprises forming a photoresist layer on an underlying layer, forming a contrast enhancement layer for enhancing the contrast of light entering the photoresist layer on the photoresist layer, selectively exposing the photoresist layer through the contrast enhancement layer to light, developing the photoresist layer to form a photoresist pattern, is characterized in that a layer containing a photobleachable agent and a material which is soluble in both a nonpolar organic solvent and an aqueous alkali solution. Specifically abietic acid, a derivative thereof, a rosin containing abietic acid as the main component, or a derivative thereof, is used as the contrast enhancement layer.

According to this constitution, since a material soluble in a nonpolar organic solvent and an aqueous alkali solution is used as a material for forming a contrast enhancement layer, namely a CEL film, the material is dissolved in a developing solution for a customary positive type photoresist so that the CEL layer is treated and removed simultaneously with the development of the photoresist. Further, the stability of a coating solution for a CEL film is remarkably high since a nonpolar organic solvent is used.

The following substances can be suitably used as the above-mentioned rosin or a derivative thereof.

(1) maleic acid-modified rosin,
(2) hydrogenated rosins containing 50% or more of 7,8,13,14-tetrahydro-abietic acid,
(3) Chinese rosin, and
(4) hydrogenated Chinese rosin.

The following compounds can be suitably used as the photobleachable agent, the compounds can be nitrones, diazonium salts, diazocarbonyls and compounds of more than two compounds selected from a nitrone, a diazonium salt, and a diazocarbonyl such as;

(1) Δ-(4-diethylaminophenyl)-N-phenylnitrone,
(2) Δ-(4-diethylaminophenyl)-N-(3′,4′-dichlorophenyl)nitrone,
(3) 5-diazomeldrum's acid, and
(4) diazonium salts soluble in an aromatic hydrocarbon solvent and represented by the following general formula:

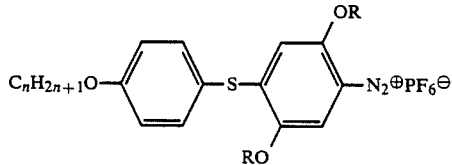

wherein $C_nH_{2n+1}$ is an alkyl group having 4 or more carbon atoms, and R is an alkyl group, for example, 2,5-diethoxy-p-octyloxyphenylmercaptobenzenediazonium hexafluorophosphate and 2,5-dibutoxy-p-octyloxyphenylmercaptobenzenediazonium hexafluorophosphate.

Particularly where 7, 8, 13, 14-tetrahydroabietic acid is used, a CEL film is treated and removed simultaneously with the development of the photoresist since it is dissolved in a developing solution for a common positive type photoresist, and the stability of a coating solution for a CEL film is further high since hydrogenated abietic acid and a nonpolar organic solvent are used.

The alkyl group R of a diazonium salt used as the photobleachable agent in the CEL film and represented by the above-mentioned formula is preferably a methyl group, an ethyl group, a butyl group, or the like.

A brief description will be given with respect to the above-mentioned diazonium salt as the photobleachable agent.

In general, a diazonium salt as the photobleachable agent is converted into a hydroxinium salt in the presence of water. It is believed that decomposition of the hydroxinium salt is most remarkable. Thus, the diazonium salt can be stably maintained in a state of a solution at room temperature where it is dissolved in a hydrocarbon solvent immiscible with water.

A diazonium salt represented by the above-mentioned general formula is prepared through the following synthesis route consisting of the steps (a) and (b).

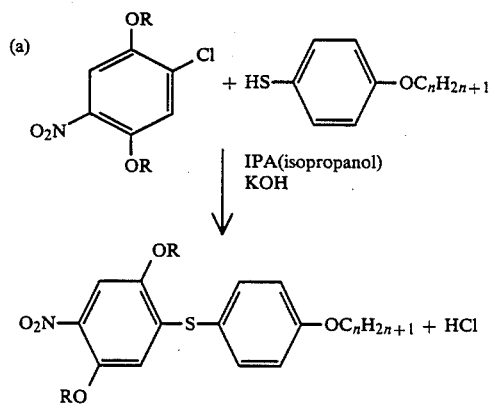

(b) The nitro group is reduced by a customary method, and the resulting amino compound is diazotized in water or an alcohol and then isolated as a hexafluorophosphate salt.

Examples of the hexafluorophosphate salt that may be used in the present invention include:

(1) 2,5-diethoxy-4-p-octyloxyphenylmercaptobenzenediazonium hexafluorophosphate,
(2) 2,5-dibutoxy-4-p-octyloxyphenylmercaptobenzenediazonium hexafluorophosphate,
(3) 2,5-diethoxy-4-p-hexyloxyphenylmercaptobenzenediazonium hexafluorophosphate,
(4) 2,5-diethoxy-4-p-stearyloxyphenylmercaptobenzenediazonium hexafluorophosphate, and
(5) 2,5-diethoxy-4-p-butyloxyphenylmercaptobenzenediazonium hexafluorophosphate.

Since a diazonium salt represented by the above-mentioned general formula has an alkyl group $C_nH_{2n+1}$ (wherein $n \geq 4$) having a large number of carbon atoms, it is dissolved in an amount of several % or more in a suitable aromatic hydrocarbon solvent such as benzene, toluene, or xylene. Since a coating solution for a CEL film which solution is used in the present invention does not contain water so that a diazonium salt that may be contained in the coating solution is hardly decomposed as compared with a diazonium salt dissolved in a polar solvent such as water, methyl cellosolve, or methanol, the coating solution is stable for a long time.

Further, since a diazonium salt that may be contained as the photobleachable agent in the CEL film according to the present invention provides a large difference in transmittance in accordance with the exposure does so that the contrast enhancement effect is high, a clear and sharp photoresist pattern with a high resolution of 1 μm or less can be formed.

BRIEF DESCRIPTION OF THE DRAWING

These and other features and advantages of the present invention will become readily apparent from the following detailed description of embodiments of the present invention, particularly when taken in connection with the accompanying drawings wherein like reference numerals designate like or functionally equivalent parts throughout, and wherein;

FIG. 2 (2A-2E) is a process diagram for explaining a conventional process for forming a photoresist pattern;

FIG. 8 is a diagram showing the bleaching characteristic curve of a diazonium salt (2,5-dibutoxy-p-octyloxyphenylmercaptobenzenediazonium hexafluorophosphate) for forming a photoresist pattern according to the present invention.

DETAILED DESCRIPTION OF THE PREFERRED EMBODIMENTS

Examples of the present invention will be described with reference to the accompanying drawings. Incidentally, figures are schematically drawn to such an extent that the gist of the present invention can be understood. With respect to the sizes, shapes, material, and disposition relations of constituents, the present invention is not limited to those mentioned in Examples unless otherwise specified. It should be understood that, although the description will be made while referring to preferred specific conditions and numerical values, the present invention is not limited to them unless otherwise specified because they are merely exemplified.

Prior to the description of Examples of the present invention, the spectrum characteristics and the bleaching characteristics of photobleachable agents that may be used as a CEL film forming material in the present invention will be described for the purpose of making the understanding of the present invention easy.

1.0 g of Chinese rosin and 1.0 g of α-(4-diethylaminophenyl)-N-phenylnitrone were dissolved in 10.0 g of monochlorobenzene to form a coating solution. The solution was applied onto a quartz substrate to form a coating film (CEL film) having a thickness of 0.7 μm. Subsequently, the coating film was baked at 80° C. for 30 minutes. Thereafter, the ultraviolet absorption spectrum of the film was measured with a spectrometer.

Figure 1A:
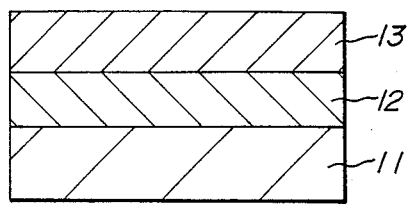
FIG. 1 (1A-1E) is a process diagram for explaining the principle of a process for forming a photoresist pattern using a CEL film.
Figure 1B:
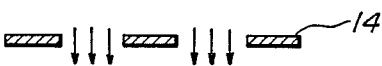
Figure 1C:
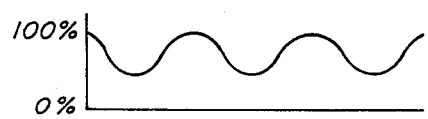
Figure 1D:
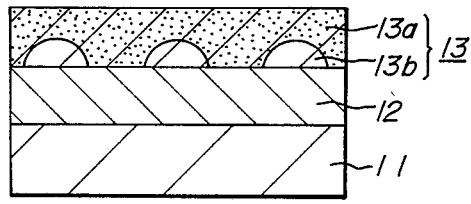
Figure 1E:
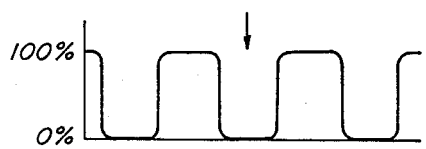
Figure 3:
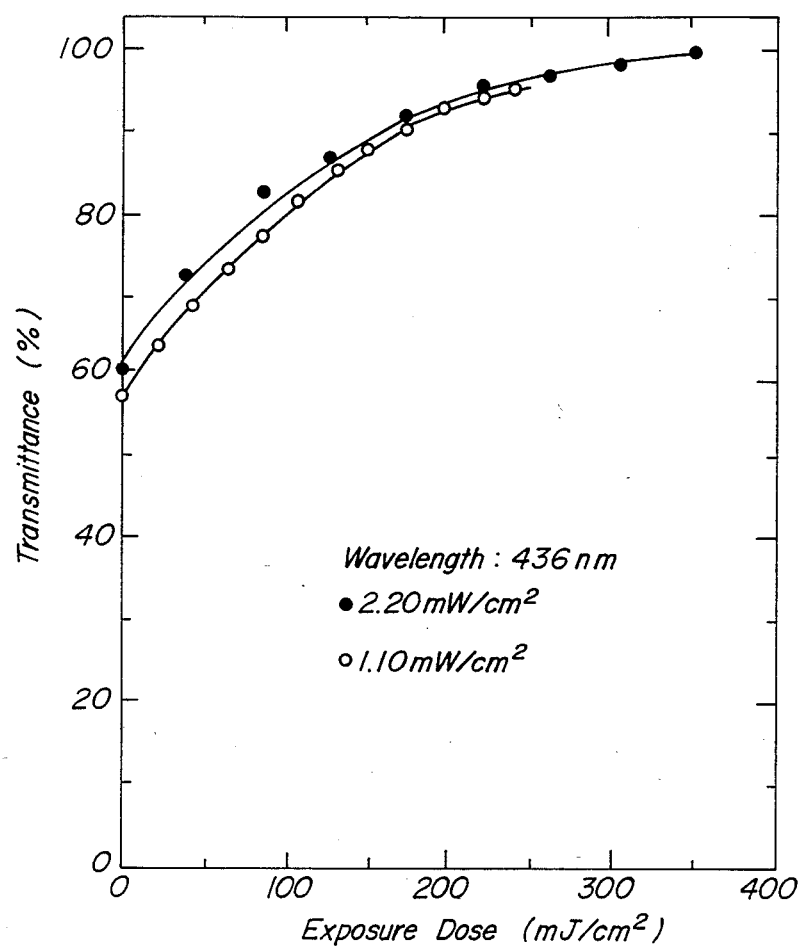
FIG. 3 is a diagram showing the bleaching characteristic curve of a conventional CEL film.
Figure 4:
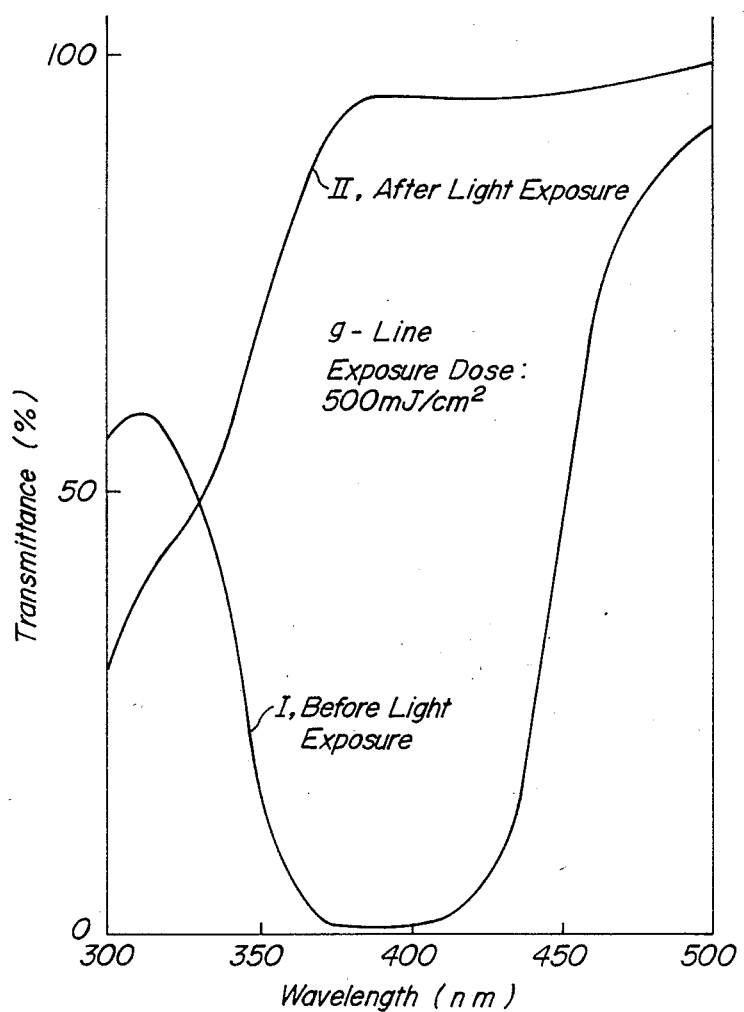
FIG. 4 is a diagram showing the absorption spectrum characteristic curve of Δ-(4-diethylaminophenyl)-N-phenylnitrone as a photobleachable agent for forming a photoresist pattern according to the present invention.

FIG. 4 is a diagram showing a curve of the ultraviolet absorption spectrum of this film and a curve of the ultraviolet absorption spectrum of the film after exposed with the g-line (436.0 nm) at a dose of 500 mJ/cm$^2$. In FIG. 4, the abscissa represents the wavelength (nm) and the ordinate represents the transmittance (%). In FIG. 4, the curve I is an absorption spectrum of the film before exposed with the g-line and the curve II is an absorption spectrum of the film after exposed with the g-line. As can be understood from the curves I and II, the absorption coefficients of the film were 3.5 μm$^{-1}$ in the case of the g-line (436 nm), 10.3 μm$^{-1}$ in the case of the h-line (405 nm), and 11.7 μm$^{-1}$ in the case of the i-line (365 nm). Thus, it is understood that this film shows extremely large absorption over a wide range of the ultraviolet region. Further, it is understood that the transmittance largely changed up to about 90% or more in the cases of the g-line and h-line and up to 80% or more in the case of the i-line as is shown in the curve II.

Figure 5:
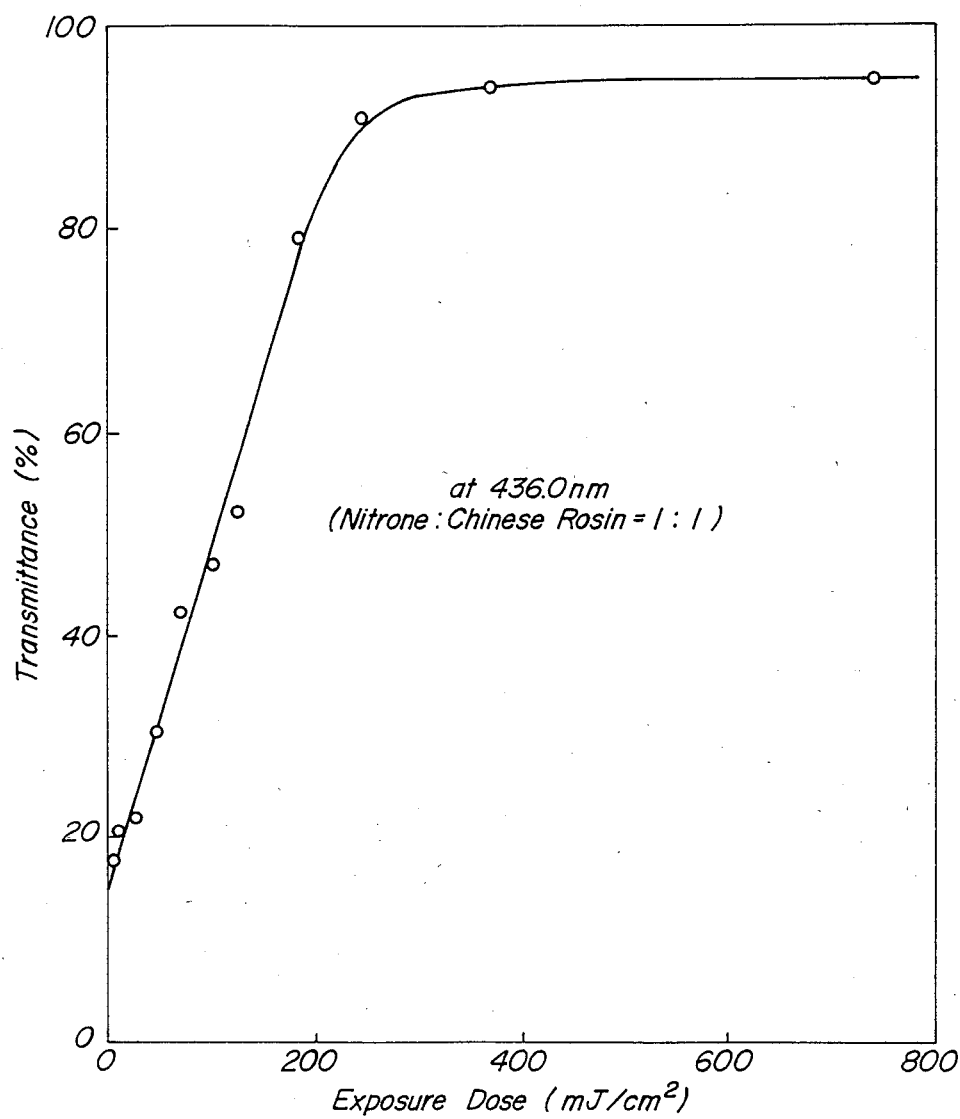
FIG. 5 is a diagram showing the bleaching characteristic curve of α-(4-diethylaminophenyl)-N-phenylnitrone as a photobleachable agent example of the process for forming a photoresist pattern according to the present invention.

FIG. 5 is a diagram showing the bleaching characteristics of a film formed in the same manner as in formation of the film for the measurement of the ultraviolet absorption spectrum and bleached with the g-line. In FIG. 5, the abscissa represents the exposure dose (mJ/cm$^2$) and the ordinate represents the transmittance (%).

With respect to a film which was obtained using α-(4-diethylaminophenyl)-N-(3',4'-dichlorophenyl)nitrone in substantially the same manner as described above, the absorption spectrum characteristics and the bleaching characteristics were examined. They respectively showed tendencies similar to those as shown in FIG. 4 and FIG. 5.

Also with respect to the following two diazonium salts soluble in an aromatic hydrocarbon solvent as photobleachable agents, the absorption spectrum characteristics and the bleaching characteristics were examined.

Firstly, the spectrum characteristics and bleaching characteristics of 2,5-diethoxy-p-octyloxyphenylmercaptobenzenediazonium hexafluorophosphate (hereinafter referred to as only "DZ-1") as the diazonium salt will be described.

A CEL film for examining these characteristics was prepared under the following conditions.

2 g of DZ-1 and 1 g of a polyester resin (Vylon #200 (trade name) manufactured by Toyobo K.K.) were dissolved in 18 g of monochlorobenzene to form a coating solution of DZ-1. A quartz substrate was coated with the DZ-1 solution by spin coating. Subsequently, the coating film was baked at a temperature of about 60° C. for about 30 minutes to effect drying. The thickness of the resulting DZ-1 film was as small as 0.65 μm.

Figure 6:
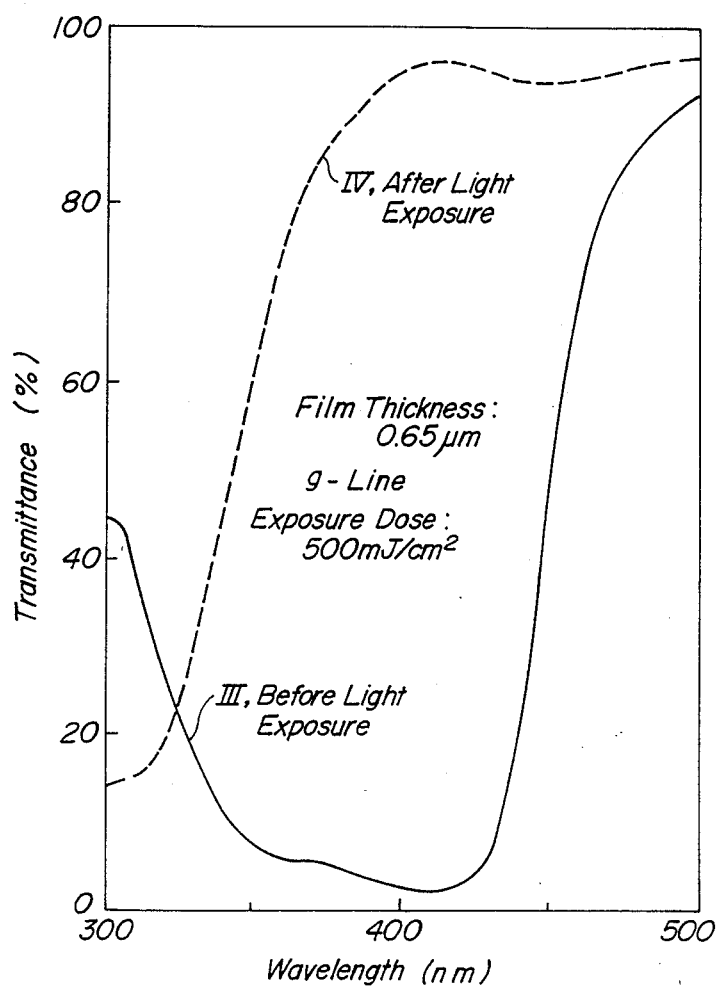
FIG. 6 is a diagram showing the absorption spectrum characteristic curve of a diazonium salt (2,5-diethoxy-p-octyloxyphenylmercaptobenzenediazonium hexafluorophosphate) for forming a photoresist pattern according to the present invention.

FIG. 6 is a diagram showing a curve of absorption spectrum characteristics of this DZ-1 film, in which diagram the abscissa represents the wavelength (nm) and the ordinate represents the transmittance (%). The curve III as shown by the solid line is an absorption spectrum of the film before exposed to light, while the curve IV as shown by a dashed line is an absorption spectrum of the film after exposed to light. The absorption spectrum characteristics of the curve IV are a result in the case where the CEL film formed in the above-mentioned manner, namely the DZ-1 film, was exposed to the g-line at an exposure dose of 500 mJ/cm$^2$. As can be understood from the curves III and IV, the absorption coefficients of the film were 3.0 $\mu m^{-1}$ in the case of the g-line (436 nm), 5.7 $\mu m^{-1}$ in the case of the h-line (405 nm), and 4.3 $\mu m^{-1}$ in the case of the i-line (365 nm). Thus, it is understood that the DZ-1 film showed extremely large absorption over a wide range of the ultraviolet region.

Further, it is understood that the transmittance largely changed up to 90% or more in the cases of the g-line and the h-line, and up to 80% or more in the case of the i-line as is shown by the curve IV of the dashed line.

Figure 7:
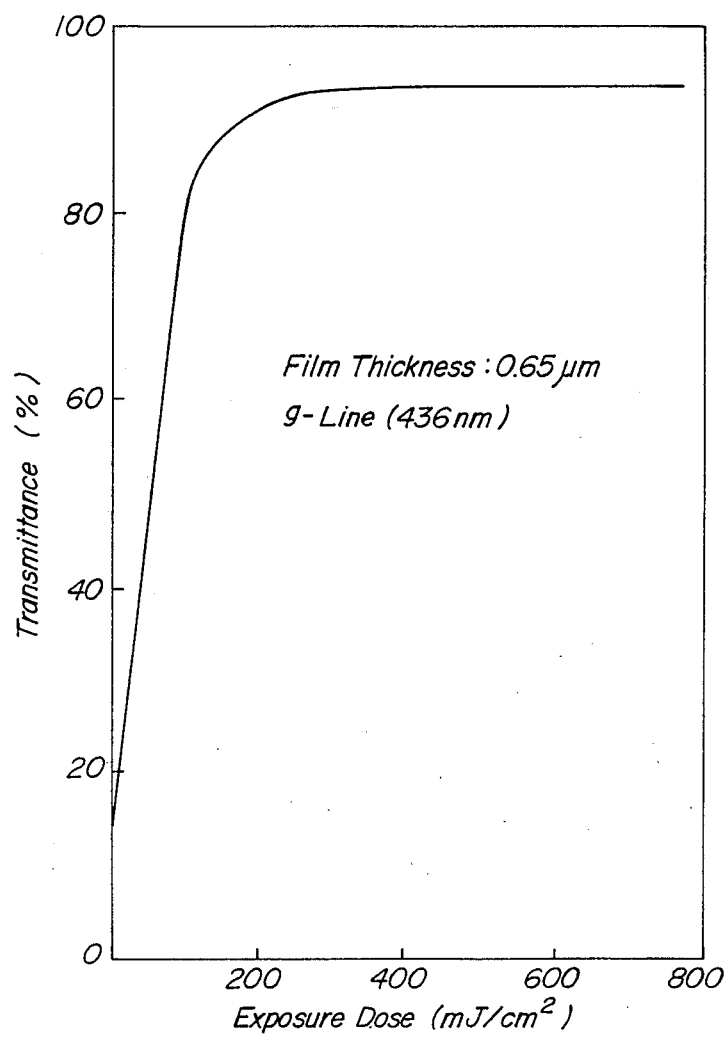
FIG. 7 is a diagram showing the bleaching characteristic curve of a diazonium salt (2,5-diethoxy-p-octyloxyphenylmercaptobenzenediazonium hexafluorophosphate) for forming a photoresist pattern according to the present invention.

The CEL film was irradiated with ultraviolet light while varying the exposure dose in accordance with the time to obtain a result as shown in FIG. 7. FIG. 7 is a diagram showing the bleaching characteristic curve of the DZ-1 film. In FIG. 7, the abscissa represents the exposure dose (mJ/cm$^2$) and the ordinate represents the transmittance (%). The data shown in this figure are a transmittance curve in the case of the g-line (436 nm). As is understood from the experimental data, the transmittance of the film before exposed to light was as low as about 10 to 15% but the transmittance of the film after the exposure dose reached about 100 mJ/cm$^2$ was as high as about 80% and the transmittance of the film reached 90% or more when the exposure of the g-line exceeded about 200 mJ/cm$^2$. Thus, it is understood that the transmittance largely changed from ten and several % to 90% in accordance with the exposure dose.

Secondly, in order to examine the bleaching characteristics of 2,5-dibutoxy-p-octyloxyphenylmercaptobenzenediazonium hexafluorophosphate (hereinafter referred to as only "DZ-2") as a diazonium salt, a CEL film was formed under the following conditions.

2 g of DZ-2 and 1 g of the same polyester resin as used as the binder polymer in the above-mentioned experiment were dissolved in 18 g of monochlorobenzene to form a coating solution of DZ-2. A quartz substrate was coated with the DZ-2 coating solution by spin coating. The resulting coating film was baked at a temperature of about 60° C. for 30 minutes to effect drying. The thickness of the DZ-2 film was as small as 0.6 $\mu$m.

The bleaching characteristics of the DZ-2 film is shown in FIG. 8, in which the abscissa represents the exposure dose (mJ/cm$^2$) and the ordinate represents the transmittance (%). As is understood from the bleaching characteristics, the transmittance of the DZ-1 film also became as high as about 90% when the exposure dose reached about 100 mJ/cm$^2$. Although the absorption spectrum characteristics of the DZ-2 film is not shown, it is presumed that they shows a tendency similar to that in the case of DZ-1.

As can be understood from the absorption spectrum characteristics and bleaching characteristics of the photobleachable agents, it can be expected that, when patterning of an underlying photoresist layer is conducted using a CEL film containing a photobleachable agent such as $\alpha$-(4-diethylaminophenyl)-N-phenylnitrone, $\alpha$-(4-diethylaminophenyl)-N-(3',4'-dichlorophenyl)nitrone, DZ-1, or DZ-2, a more clear and more sharp photoresist pattern than that formed using a conventional CEL film can be formed since an effect of enhancing the contrast of a light image of a mask pattern is remarkably exhibited by the former CEL film.

Th following Examples will be described with reference to FIGS. 9A to 9D as a common drawing.

EXAMPLE 1

In this Example, Chinese rosin was used as a film forming material.

Figure 9A:
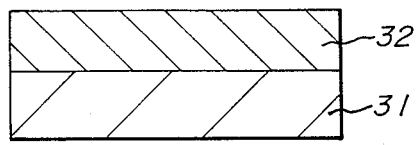
FIG. 9 (9A-9D) is a process diagram to explain examples of a process for forming a photoresist pattern according to the present invention.

A photoresist material (NPR-820 commercially available from Nagase & Company Ltd.) was applied onto an underlying layer such, for example, a silicon substrate (silicon wafer) 31 with a spinner and then baked on a hot plate at a temperature of 105° C. for 60 seconds to form an underlying resist film 32 having a thickness of 0.9 $\mu$m (FIG. 9A).

Figure 9B:
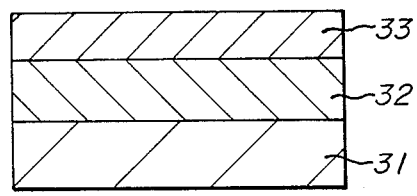

Subsequently, a CEL coating solution obtained by dissolving 1.0 g of Chinese rosin and 1.0 g of $\alpha$(4-diethylaminophenyl)-N-phenylnitrone as a photobleachable agent in 10.0 g of monochlorobenzene was applied onto the photoresist layer 32 with a spinner to form a CEL film 33 having a thickness of 0.7 $\mu$m (FIG. 9B).

Figure 9C:
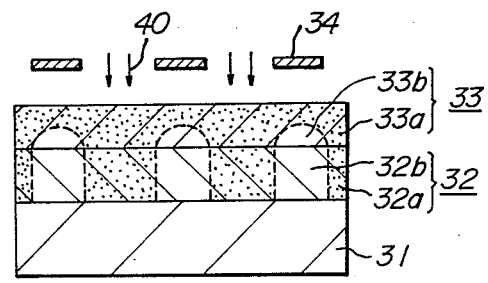

The underlying photoresist layer 32 was irradiated through a mask pattern of a photomask 34 and the CEL film 33 with ultraviolet radiation 40 having a wavelength range of about 350 to 450 nm from a mercury lamp at a dose of 500 mJ/cm$^2$ (FIG. 9C). The reason why a wavelength range of 350 to 450 nm was chosen resides in that, when the wavelength range is outside this range, the sensitivity of the photoresist is lowered and the absorption spectrum characteristics and bleaching characteristics of the CEL are also deteriorated. The exposure apparatus used was a 1:1 reflection-projection type aligner (reference No. 500 HT commercially available from Perkin-Elmer Corporation). In the figure, reference numerals 33a and 32a designate the exposed portions of the CEL film 33 and photoresist film 32, respectively, while reference numerals 33b and 32b designate the unexposed portions of the CEL film 33 and photoresist film 32, respectively.

Since the dose of this ultraviolet radiation with which the CEL film 33 was directly irradiated from the light transmitting region of the photomask 34 is 450 mJ/cm$^2$, the light transmittance in the light-transmitting region of the photomask is about 95%. In contrast, since the dose is small in the region where light is shut off by the mask 34, the transmittance in the portion of the CEL film 33 shadowed from the border of the two region is abruptly lowered and close to zero around the center of the shadow of the mask. Therefore, the light intensity in the border of the portion 32a of the photoresist layer 32 exposed through the CEL film 33 to the light and the portion 32b of the photoresist layer not exposed to light varies sharply, namely substantially stepwise.

Figure 9D:
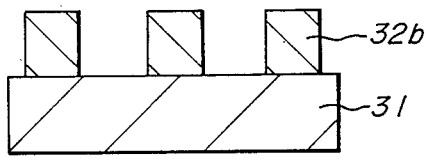

After completion of the above-mentioned light exposure, development was directly done using a metal-free developing solution (838 commercially available from Nagase & Company Ltd.) for 35 seconds without the step of preliminary removal of the CEL film 33. The above-mentioned CEL film 33 was instantaneously dissolved and removed after initiation of development, and development of the photoresist layer 32 began. Thus, the exposed portion 32a was removed and the unexposed portion 32b remained to form a positive photoresist as shown in FIG. 9D.

The cross-sectional shape of the photoresist pattern obtained was observed with a scanning electron microscope. As a result, it was found that a pattern larger than a 1.5 μm line and space was formed in a steep state close to vertical to the surface of the substrate in the side wall portion thereof. Thus, a photoresist pattern having a substantially rectangular, clean and sharp cross sectional shape was obtained. Also, a 1 μm line and space pattern was obtained.

COMPARISON EXAMPLE 1

A pattern was formed by light exposure, development and other treatments in the same manner as in Example 1, except that no CEL film was provided on the photoresist layer. The exposure does was 100 mJ/cm$^2$.

The photoresist pattern obtained was observed in the same manner as in Example 1 with a scanning electron microscope. As a result, it was found that the inclination of the side wall portion of the pattern against the surface of the substrate is more gentle than that of the pattern obtained in Example 1, that the cross-sectional shape was close to a trapezoid, and that the photoresist pattern was not so clear and sharp as that obtained in Example 1. When formation of a 1 μm line and space pattern was attempted, the thickness of the photoresist layer was less than half of that in the case of Example 1. Therefore, it was found that in this case the function as the photoresist layer could not be expected.

EXAMPLE 2

A photoresist layer 32 was formed on a substrate 31 in the same manner as in Example 1 (FIG. 9A).

1.0 g of Chinese rosin and 0.5 g of α-(4-diethylaminophenyl)-N-(3′,4′-dichlorophenyl)nitrone were dissolved in 7.0 g of monochlorobenzene to obtain a CEL coating solution. This coating solution was applied onto the photoresist layer 32 in the same manner as in Example 1 to form a CEL film having a thickness of 0.7 μm as a photosensitive layer (FIG. 9B).

The underlying photoresist layer 32 was exposed to light through the CEL film 33 with a mask pattern of a photomask by using an optical reduction type aligner Model Nikon NSR 1505 G3A (FIG. 9C). Development was directly done in the same manner as in Example 1 without the step of preliminary removal of the CEL film 33. The cross-sectional shape of the photoresist pattern obtained was observed with a scanning electron microscope. As a result, it was found that a clear and sharp photoresist pattern having a side wall portion close to vertical to the surface of the substrate, a rectangular cross-sectional shape, and a 0.6 μm line and space was obtained.(FIG. 9D).

COMPARISON EXAMPLE 2

A pattern was formed by light exposure, development and other treatments in substantially the same manner as in Example 2, except that no CEL film was provided on the photoresist layer. The exposure dose was 100 mJ/cm$^2$.

The photoresist pattern obtained was observed in the same manner as in Example 2 with a scanning electron microscope. As a result, it was found that the inclination of the side wall portion of the pattern against the surface of the substrate is gentle, that the cross-sectional shape was close to a trapezoid, and that a 0.7 μm pattern cold be formed but a 0.6 μm pattern could not be formed.

EXAMPLE 3

In this Example, hydrogenated rosin was used as a film forming material.

A photoresist material (NPR-820 commercially available from Nagase & Company Ltd.) was applied onto a silicon substrate (silicon wafer) 31 as an underlying layer with a spinner and then baked on a hot plate at a temperature of 105° C. for 60 seconds to form an underlying photoresist film 32 having a thickness of 0.9 μm (FIG.9A).

Subsequently, a CEL coating solution obtained by dissolving 1.0 g of hydrogenated rosin (commercially available from Arakawa Kagaku Kogyo K.K., trade name: Hi Pale, content of 7, 8, 13, 14-tetrahydroabietic acid: 50% or more) and 1.0 g of α-(4-diethylaminophenyl)-N-phenylnitrone as a photobleachable agent in 10.0 g of monochlorobenzene was applied onto the photoresist layer 32 with a spinner to form a CEL film 33 having a thickness of 0.7 μm (FIG. 9B).

The underlying photoresist layer 32 was irradiated through a mask pattern of a photomask 34 and the CEL film 33 with ultraviolet radiation 40 having a wavelength range of about 350 to 450 nm from a mercury lamp at a dose at a dose of 500/cm$^2$ (FIG. 9C). The reason why a wavelength range of 350 to 450 nm was chosen resides in that, when the wavelength range is outside this range, the sensitivity of the photoresist is lowered and the absorption spectrum characteristics and bleaching characteristics are also deteriorated. The exposure apparatus used was a 1:1 reflection-projection type aligner (reference No. 500 HT commercially available from Perkin-Elmer Corporation). In the figure, characters 33a and 32a designate the exposed portions of the CEL film 33 and photoresist film 32, respectively, while characters 33b and 32b designate the unexposed portions of the CEL film 33 and photoresist film 32, respectively.

Since the dose of this ultraviolet radiation with which the CEL film 33 was directly irradiated from the light transmitting region of the photomask 34 is 450 mJ/cm$^2$, the light transmittance in the light-transmitting region of the photomask is about 95%. In contrast, since the dose is small in the region where light is shut off by the mask 34, the transmittance in the portion of the CEL film 33 shadowed from the border of the two region is abruptly lowered and close to zero around the center of the shadow of the mask. Therefore, the light intensity in the border of the portion 32a of the photoresist layer 32 exposed through the CEL film 33 to the light and the portion 32b of the photoresist layer not exposed to light varies sharply, namely substantially stepwise.

After completion of the above-mentioned light exposure, development was directly done using a metal-free developing solution (934 commercially available from Nagase & Company Ltd.) for 35 seconds without the step of preliminary removal of the CEL film 33. The above-mentioned CEL film 33 was instantaneously dissolved and removed after initiation of development, and development of the photoresist layer 32 began. Thus, the exposed portion 32a was removed and the unexposed portion 32b remained to form a positive photoresist pattern as shown in FIG. 9D.

The cross-sectional shape of the photoresist pattern obtained was observed with a scanning electron microscope. As a result, it was found that a pattern larger than a 1.5 μm line and space was formed in a steep state close to vertical to the surface of the substrate in the side wall portion thereof. Thus, a photoresist pattern having a substantially rectangular, clean and sharp cross-sectional shape was obtained. Also, a 1 μm line and space pattern was obtained.

COMPARISON EXAMPLE 3

A pattern was formed by light exposure, development and other treatments in the same manner as Example 3, except that no CEL film was provided on the photoresist layer. The exposure dose was 100 mJ/am².

The photoresist pattern obtained was observed in the same manner as in Example 3 with a scanning electron microscope. As a result, it was found that the inclination of the side wall portion of the pattern against the surface of the substrate is more gentle than that of the pattern obtained in Example 3, that the cross-sectional shape was close to a trapezoid, and that the photoresist pattern was not so clear and sharp as that obtained in Example 3. When formation of a 1 μm line and space pattern was attempted, the thickness of the photoresist layer was less than half of that in the case of Example 3. Therefore, it was found that in this case the function as the photoresist layer could not be expected.

EXAMPLE 4

A photoresist layer 32 was formed on a substrate 31 in the same manner as in Example 3 (FIG. 9A).

Subsequently, 1.0 g of hydrogenated rosin (Hi Pale as mentioned above) and 0.5 g of α-(4-diethylaminophenyl)-N-(3',4'-dichlorophenyl)nitrone were dissolved in 7.0 g of monochlorobenzene to obtain a CEL coating solution. This coating solution was applied onto a photoresist layer 32 in the same manner as in Example 3 to form a CEL film having a thickness of 0.7 μm as s photosensitive layer (FIG. 9B).

The underlying photoresist layer 32 was exposed to light through the CEL film 33 with a mask pattern of a photomask by using an optical reduction type aligner Model Nikon NSR 1505 G3A. Development was directly done in the same manner as in Example 3 without the step of preliminary removal of the CEL film 33. The cross-sectional shape of the photoresist pattern obtained was observed with a scanning electron microscope. As a result, it was found that a clear and sharp photoresist pattern having a side wall portion close to vertical to the surface of the substrate, a rectangular cross-sectional shape, and a 0.6 μm line and space was obtained.

COMPARISON EXAMPLE 4

A pattern was formed by light exposure, development and other treatments in substantially the same manner as in Example 4, except that no CEL film was provided on the photoresist layer. The exposure dose was 100 mJ/cm².

The photoresist pattern obtained was observed in the same manner as in Example 4 with a scanning electron microscope. As a result, it was found that the inclination of the side wall portion of the pattern against the surface of the substrate is gentle, that the cross-sectional shape was close to a trapezoid, and that a 0.7 μm pattern could be formed but a 0.6 μm pattern could not be formed.

EXAMPLE 5

A silicon wafer as an underlying layer was coated with OFPR-800 (a photoresist manufactured by Tokyo Oka Kogyo K.K) and then prebaked at 80° C. for 1 minute to form a photoresist layer having a thickness of 1.0 μm. The photoresist layer was coated with a solution obtained by dissolving 1.0 g of a maleic acid-modified rosin and 1.0 g of α-(4-diethylaminophenyl)-N-phenylnitrone in 10 g of monochlorobenzene to form a CEL film having a thickness of 0.6 μm. The resulting substrate was exposed to the g-line of a stepper (NA=0.35) through a reticle. The dose was 300 mJ/cm². Subsequently, development was conducted using NMD-W (a developing solution manufactured by Tokyo Oka Kogyo K.K.) at 23° C. for 40 seconds. An OFPR-800 pattern of a 0.7 μm line and space with a rectangular cross-sectional could be obtained.

EXAMPLE 6

2 g of 2,5-dibutoxy-p-octyloxyphenylmercaptobenzenediazonium hexafluorophosphate and 2 g of hydrogenated Chinese rosin (manufactured by Arakawa Kagaku Kogyo K.K.) were dissolved in 25 ml of xylene. The resulting solution was then filtered through a membrane filter having a throughhole diameter of 0.45 μm to prepare a coating solution.

A 5 inch silicon wafer as an underlying layer was coated with a positive type photoresist TSMR 8800 (10 cp., manufactured by Tokyo Oka Kogyo K.K.) by spin coating with a photoresist coater (D-Spin 636 manufactured by Dainippon Screen Mfg. Co., Ltd.) to form a photoresist layer having a thickness of 1.07 μm. The silicon wafer having the photoresist layer thereon was baked on a hot plate at 100° C. for 60 seconds. The above-mentioned coating solution was applied onto the photoresist layer by spin coating (number of revolutions: 1,200 rpm) to form a CEL film having a thickness of 0.49 μm.

Subsequently, light exposure was conducted through a test chart mask (of inventor's own making) having a line and space by using a reduction type aligner (NSR 1505 G3A manufactured by Nippon Kogaku K.K., aperture ratio : 0.35). Thereafter, puddle development was done with a developing solution NSD-TD (an aqueous solution containing 2.38% of tetramethylammonium hydroxide as the main component, manufactured by Tokyo Oka Kogyo K.K.) at 23° C. for 40 seconds. After washing with water, the wafer was dried at 100° C. for 60 seconds. Under these conditions, the photoresist pattern was resolved to a 0.7 μm line and space pattern (required exposure dose : 400 mJ/cm²) and a 0.6 μm line and space pattern (required exposure dose: 450 mJ/cm²) which had a substantially rectangular cross-section, and was resolved to a 0.55 μm line and space pattern (required exposure dose: 500 mJ/cm²) without reduction of the film thickness. The CEL film was completely removed.

EXAMPLE 7

2 g of 2,5-diethoxy-p-octyloxyphenylmercaptobenzenediazonium hexafluorophosphate and 2 g of Chinese rosin (commercially available from Arakawa Kagaku Kogyo K.K.) were dissolved in 25 ml of monochlorobenzene, and the resulting solution was filtered through a filter having a throughhole diameter of 0.2 μm to prepare a coating solution.

A silicon wafer as an underlying layer was coated with TSMR-8800, baked, and coated with the above-mentioned coating solution by spin coating in substantially the same manner as in Example 6.

When light exposure at a dose of 550 mJ/cm² and development were done in substantially the same manner, the photoresist pattern was resolved to a 0.55 μm line and space pattern.

EXAMPLE 8

2 g of Chinese rosin and 2 g of 5-diazomeldrum's acid were dissolved in 20 ml of xylene, and the resulting solution was filtered through a filter having a through-hole diameter of 0.2 μm to prepare a coating solution. A silicon wafer as an underlying layer was coated with OAP (a contact enhancement agent manufactured by Tokyo Oka Kogyo K.K.). MP-2400 (a photoresist manufactured by Shipley Corporation) was applied onto the OAP layer and prebaked at 100° C. for 1 minute to form a photoresist layer having a thickness of 1 μm. The above-mentioned coating solution was applied onto the photoresist layer to form a CEL film having a thickness of 0.5 μm. Thereafter, light exposure was conducted with a stepper (NA=0.35) having an excimer laser (248 nm) of KrF as the light source. The exposure dose was 400 mJ/cm$^2$. Development was done with a developing solution obtained by diluting MP-2401 (a developing solution manufactured by Shipley Corporation) with water to a four-fold volume at 23° C. for 1 minute, followed by rinsing with water for 30 seconds. A 0.5 μm and space pattern having a rectangular cross-section could be formed.

COMPARISON EXAMPLE 5 (COMPARISON EXAMPLE FOR EXAMPLE 8)

A silicon wafer having only a resist layer of MP-2400 was exposed to light (exposure dose: 100 mJ/cm$^2$) and developed in substantially the same manner as in Example 8. A 0.5 μm line and space was separated but the cross-sectional shape was triangular.

REFERENCE EXAMPLE FOR EXPLAINING QUALITY OF FILM

OFPR-800 (a photoresist manufactured by Tokyo Oka Kogyo K.K.) was applied onto a silicon wafer and baked at 100° C. for 1 minute to form a photoresist layer having a thickness of 2 μm. Thereafter, a xylene solution of Chinese rosin was applied onto the photoresist layer and baked at 100° C. for 1 minute to form a Chinese rosin film having a thickness of 1 μm. Light exposure was conducted for 5 minutes with a 250W mercury lamp. The exposure dose was 2 J/cm$^2$. When the resulting substrate was observed, there were no bubbles of an N$_2$ gas.

For comparison, an aqueous solution of polyvinyl alcohol was applied onto a photoresist layer of OFPR-800 formed on a silicon wafer and baked at 100° C. for 1 minute to form a polyvinyl alcohol film having a thickness of 0.1 μm. Thereafter, light exposure was conducted with a 250W mercury lamp for 1 minute (exposure dose: 400 mJ/cm$^2$). When the resulting substrate was observed, there were many bubbles between the polyvinyl alcohol film and the OFPR-800 layer.

As explained in detail, according to the present invention, since a rosin or the like soluble in an aqueous alkali solution is used as a CEL film forming material, development can be immediately conducted after light exposure without separate addition of the step of removing the CEL film so that the process is simplified. Further, a coating solution for the CEL film is very stable without decomposition of a photobleachable agent because a nonpolar organic solvent is used. In the case of using a hydrogenated rosin, the stability of a coating solution is further high. Therefore, the coating solution for the CEL film can be sufficiently resistant to long-term storage. Thus, the aforementioned problems can be solved.

In the case of using a CEL film containing a rosin or the like and a diazonium salt soluble in an aromatic hydrocarbon solvent, there are advantages that the process for forming a photoresist pattern can be simplified, that the stability of a coating solution for a CEL film is high, that the amount of coating may be small since uniformity of the CEL film is good, and that a thick CEL film may be provided since the film has a high gas permeability.

The experimental results as to uniformity of a CEL film in the case of using a diazonium salt as a photobleachable agent will now be described.

REFERENCE EXAMPLE FOR EXPLAINING UNIFORMITY OF FILM 1 g of Chinese rosin and 1 g of 2,5-dibutoxy-p-octyloxyphenylmercaptobenzenediazonium hexafluorophosphate were dissolved in 10 g of xylene and then filtered with a filter having a throughhole diameter of 0.2/ μm.

This solution was applied onto a 5 inch silicon wafer by spin coating, and then baked at 80° C. for 1 minute to obtain a film, followed by a measurement of a film thickness. The average film thickness was 6,200 Å. In a measurement at 18 points on a diameter, $\nu=9$Å and the range (a difference between the maximum thickness and the minimum thickness)=23Å.

When the amount of the coating solution at the time of coating was varied to 2 ml, 3 ml, and 5 ml, no substantial dispersion of the film thickness was recognized.

For comparison, 1 g of polyvinyl alcohol and 0.15 g of diphenylamine-p-diazonium sulfonate were dissolved in 10 g of water. The resulting solution was filtered with a filter having a throughhole diameter of 0.2 μm.

Thereafter, the solution was applied onto a 5 inch silicon wafer by spin coating, and then baked at 80° C. for 1 minute to obtain a film, followed by a measurement of a film thickness. The average film thickness was 3,520 Å. In a measurement at 18 points on a diameter, $\sigma=50$ Å and the range (a difference between the maximum thickness and the minimum thickness)=150 Å.

The amount of the coating solution at the time of coating was varied to 2 ml, 3 m and 5 ml. When it was 2 ml or 3 ml, the variation in the film thickness could be recognized to such an extent that the interference color was clearly observed, and nonuniformity in the film thickness was as large as 500 Å or more in terms of the range.

What is claimed is:

1. A process for forming a photoresist pattern which consisting essentially of the steps of coating an underlying layer with a photoresist to form a photoresist layer on said underlying layer, coating the upper surface of the resulting photoresist layer with a contrast enhancement film formed from a solution of the material thereof in a nonpolar solvent to form a contrast enhancement layer, exposing a portion of the resulting structure pattern wise through a photomask to a light to which both of said photoresist and said contrast enhancement layer are light-sensitive, and developing said photoresist layer to form a photoresist pattern by an aqueous alkaline solution to remove the exposed portions of the photoresist, while simultaneously dissolving and removing said contrast layer, thereby leaving the unexposed portions of the photoresist on the underlying layer; and wherein the material of said contrast enhancement layer comprising effective amounts of a photobleachable dye selected from the group consisting of a diazonium salt, a diazocarbonyl compound and a nitrone compound, and compounds of more than two materials selected from the group consisting of nitrone, diazonium salt and diazocarbonyl, effective amounts of a binder selected from the group consisting of abietic acid and a rosin which contains abietic acid as the main component, which binder is soluble in both an aqueous alkaline solution and a nonpolar organic solvent and which binder is present in sufficient amounts to bind the photobleachable dye, said photobleachable dye being present in a sufficient quantity amount to improve the contrast in the photoresist layer.

2. A process for forming a photoresist pattern as claimed in claim 1, wherein Chinese rosin is used as the derivative of said abietic acid or the derivative of the said rosin containing abietic acid as the main component.

3. A process for forming a photoresist pattern as claimed in claim 1, wherein hydrogenated rosin is used as the derivative of said abietic acid or the derivative of the said rosin containing abietic acid as the main component.

4. A process for forming a photoresist pattern as claimed in claim 1, wherein maleic acid-modified rosin is used as the derivative of said abietic acid or the derivative of said rosin containing abietic acid as the main component.

5. A process for forming a photoresist pattern as claimed in claim 1, wherein 7, 8, 13, 14-tetrahydroabietic acid is used as said abietic acid and wherein said photobleachable agent is α-4-(diethylaminophenyl)-N-phenylnitrone.

6. A process for forming a photoresist pattern as claimed in claim 1, wherein a hydrogenated rosin containing 50% or more of 7, 8, 13, 14-tetrahydroabietic acid as the main component is used as said rosin, and wherein said rosin, and wherein said photobleachable agent is α-4-(diethylaminophenyl)-N-phenylnitrone.

7. A process for forming a photoresist pattern as claimed in claim 1, wherein 7, 8, 13, 14-tertrahydroabietic acid is used as said abietic acid, and wherein said photobleachable agent is α-(4-diethylaminophenyl)-N-(3', 4'-dichlorophenyl)nitrone.

8. A process for forming a photoresist pattern as claimed in claim 1, wherein Chinese rosin is used, and wherein said photobleachable agent is α-(4-diethylaminophenyl)-N-phenylnitrone.

9. A process for forming a photoresist pattern as claimed in claim 1, wherein Chinese rosin is used, and wherein said photobleachable agent is α-(4-diethylaminophenyl)-N-3',4'-dichlorophenyl)nitrone.

10. A process for forming a photoresist pattern as claimed in claim 1, wherein Chinese rosin is used, and wherein said photobleachable agent is 5-diazomeldrum's acid.

11. A process for forming a photoresist pattern as claimed in claim 1, wherein said photobleachable agent is a diazonium salt soluble in an aromatic hydrocarbon solvent and represented by a general formula:

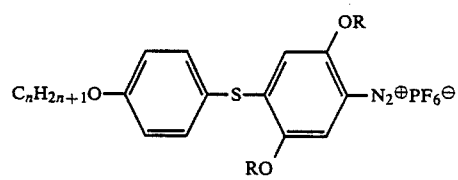

wherein $C_nH_{2n+1}$ is an alkyl group having 4 or more carbon atoms, and R is an alkyl group.

12. A process for forming a photoresist pattern as claimed in claim 11, wherein Chinese rosin is used, and wherein said photobleachable agent is 2,5-diethoxy-p-octyloxyphenylmercaptobenzenediazonium hexafluorophosphate.

13. A process for forming a photoresist pattern as claimed in claim 11, wherein Chinese rosin is used, and wherein said photobleachable agent is 2,5-dibutoxy-p-octyloxyphenylmercaptobenzenediazonium hexafluorophosphate.

14. A process for forming a photoresist pattern as claimed in claim 11, wherein hydrogenated Chinese rosin is used, and wherein said photobleachable agent is 2,5-dibutoxy-p-octyloxyphenylmercaptobenzenediazonium hexafluorophosphate.

15. A process for forming a photoresist pattern as claimed in claim 1, wherein said photoresist layer is coated with a coating solution obtained by dissolving said photobleachable agent and said material selected from the group of said abietic acid, said derivative thereof, said rosin containing abietic acid as the main component, and said derivative thereof in monochlorobenzene to form said contrast enhancement layer.

16. A process for forming a photoresist pattern as claimed in claim 1, wherein said photoresist layer is coated with a coating solution obtained by dissolving said photobleachable agent and said material selected from the group of said abietic acid, said derivative thereof, said rosin containing abietic acid as the main component, and said derivative thereof in xylene to form said contrast enhancement layer.

* * * * *